US006612866B2

(12) United States Patent
Germer et al.

(10) Patent No.: US 6,612,866 B2
(45) Date of Patent: Sep. 2, 2003

(54) VOLTAGE ISOLATOR CONNECTOR DEVICE FOR PRINTED CIRCUIT BOARD ASSEMBLY

(75) Inventors: Warren R. Germer, Hampton, NH (US); Patrick J. Horan, Dover, NH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/681,766

(22) Filed: Jun. 1, 2001

(65) Prior Publication Data

US 2002/0182911 A1 Dec. 5, 2002

(51) Int. Cl.[7] ............................................. H01R 33/945
(52) U.S. Cl. ....................................................... 439/517
(58) Field of Search ................................. 439/517, 186, 439/281

(56) References Cited

U.S. PATENT DOCUMENTS

| 4,673,872 A | | 6/1987 | Germer et al. |
|---|---|---|---|
| 4,977,368 A | | 12/1990 | Munday et al. |
| 5,087,875 A | | 2/1992 | Balch et al. |
| 5,668,705 A | | 9/1997 | Balch et al. |
| 6,004,140 A | * | 12/1999 | Kato et al. ..................... 439/65 |
| 6,095,856 A | * | 8/2000 | Horan et al. ................. 439/567 |

* cited by examiner

Primary Examiner—Renee Luebke
Assistant Examiner—Ann M McCamey
(74) Attorney, Agent, or Firm—Karl A. Vick, Esq.; Armstrong Teasdale LLP (57) ABSTRACT

A voltage isolator connector is described for a printed circuit board. The connector includes an end wall; a first side wall extending from the end wall, and a second side wall extending from the end wall. The first and second side walls form an isolator compartment with the end wall, and the end wall and the first and second side walls are configured for attachment to the printed circuit board.

7 Claims, 8 Drawing Sheets

VOLTAGE ISOLATOR CONNECTOR DEVICE FOR PRINTED CIRCUIT BOARD ASSEMBLY

BACKGROUND OF INVENTION

This invention relates generally to connector devices for printed circuit board assemblies, and, more particularly, to an isolator device for isolating high voltage power supply contacts from lower voltage electronic circuitry, such as those found in electronic electricity meters.

Conventional electrical metering systems include a plurality of electrical meters, such as induction or electronic type watthour meters, for measuring the energy consumption of individual electrical energy users. Each electronic type meter generally includes metering circuitry for measuring the power consumption of the electrical load associated with the meter and for tabulating the load data related to the measured power consumption. The metering circuitry of conventional electrical meters generally includes an internal current sensor mounted within the housing of the electrical meter for sensing the line current supplied to the associated electrical load and for producing an output signal related to the line current.

To ensure accuracy of the meter, at least some types of electronic meters include a revenue guard board that monitors a single phase of a three phase power supply for voltage and/or current sensing. When the monitored phase of the three phase power supply is interrupted, the revenue guard circuitry then monitors another of the three phases of the three phase power supply so that the meter continues to measure power consumption even when one of the three phases of the power supply is interrupted. Typically, such revenue guard boards are directly coupled to the electronics of the meter, such as a microprocessor, other option boards, and other electronic components of the meter. This construction can be problematic, however, in that the revenue guard board operates at high voltage in comparison to the electronics of the meter, thereby requiring proper space allocation of the high and low voltage components and increasing a required size of the meter to accommodate the respective electrical components.

Furthermore, a variety of connectors have been employed to isolate high voltage power supply contacts, such as the power supply contacts in the meter, from each other and from lower voltage contacts and components in the meter electronics. During normal operation of the meter, the high voltage power supply contacts are vulnerable to voltage excursions due to lightning and switching transients occurring throughout the power distribution system. Without a high level of isolation between power supply contacts, undesirable arcing can occur. Aside from property damage and safety issues, this exposure of the power supply contacts may compromise proper meter operation, the life span of the meter and reliability of the meter.

SUMMARY OF INVENTION

In one aspect, a voltage isolator connector is provided for a printed circuit board. The connector includes an end wall; a first side wall extending from the end wall, and a second side wall extending from the end wall. The first and second side walls form an isolator compartment with the end wall, and the end wall and the first and second side walls are configured for attachment to the printed circuit board.

In another aspect a printed circuit board assembly includes a printed circuit board including opposite first and second surfaces, a plurality of high voltage contacts extending from the first surface, and an opening through the board. A voltage isolator connector is configured for insertion though the opening and forming at least one isolator compartment about at least one of the high voltage contacts when the connector is partially inserted through the opening. The voltage isolator connector is further configured for locking engagement with said printed circuit board at opposite ends of the connector.

In another aspect, a meter includes a base module comprising power supply leads and a power supply connector and at least one printed circuit board for connection to the power supply leads. The printed circuit board comprises at least first and second surfaces, at least one power supply contact, and an opening through the board. A voltage isolator connector is partially inserted through the opening and forms an isolator compartment about the at least one power supply contact, and a power supply connector is inserted over the voltage isolator connector to establish an electrical connection with the at least one power supply contact.

In another aspect, a method is provided for establishing an electrical connection between a three phase power supply and a printed circuit board including a plurality of power supply contacts. The method employs a voltage isolator connector having an open end and at least one isolator compartment formed into the open end, and the printed circuit board includes an opening adjacent the plurality of power supply contacts. The method comprises the steps of inserting the open end of the voltage isolator connector through the opening of printed circuit board such that the voltage isolator connector extends partially through the opening, and securing the voltage isolator connector in position relative to the board such that the at least one isolator compartment isolates at least one of the power supply contacts from another of the power supply contacts.

DETAILED DESCRIPTION

Figure 1:
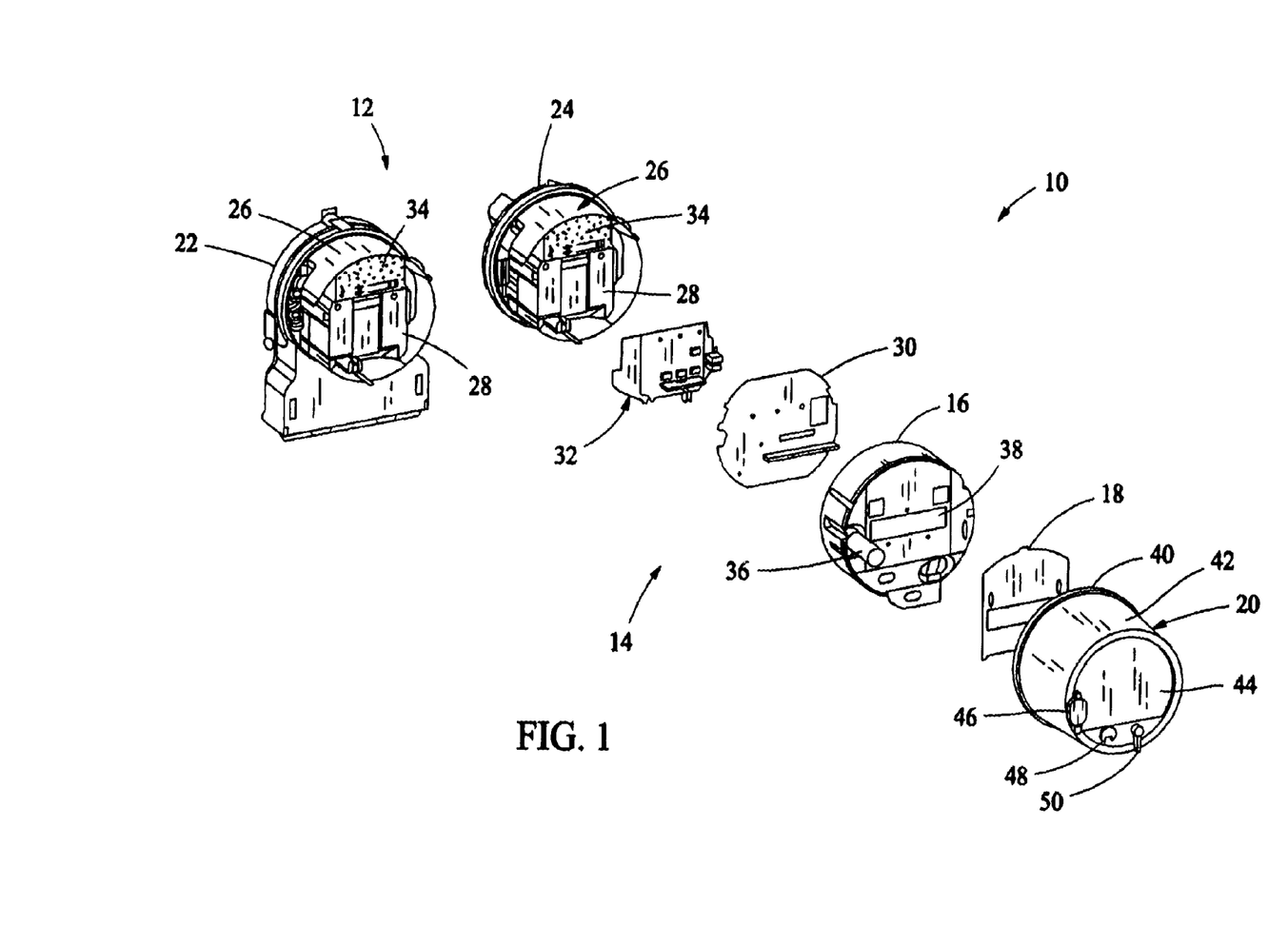
FIG. 1 is an exploded view of an electric meter including a base barrier.

FIG. 1 is an exploded view of one embodiment of an electric meter 10 in which the present invention may be employed. While the invention is described in reference to a particular electric meter 10, it is recognized that the invention may be equally employed in alternative types and configurations of electric meters. Further, it is contemplated that the benefits of the invention accrue to other application of printed circuit board assemblies in which isolation of high voltage contacts is desirable. Consequently, the description set forth below is for illustrative purposes only, and is not intended to restrict or limit the practice of the present invention to a meter application, nor to any particular electric meter, such as meter 10.

Electric meter 10 is modular in construction and includes, in one embodiment, a base module assembly 12, an electronics module assembly 14, a bezel 16 for containing electronics module assembly 14, a nameplate 18 for attachment to bezel 16, and a cover 20.

Base module assembly 12, in alternative embodiments, is an A type base assembly 22 that is wired to the electrical system (not shown) being metered, or an S type assembly 24 that is adapted for connection to a pre-wired socket (not shown). While base module assemblies 22, 24 are structurally different, they are functionally interchangeable and consequently, for purposes of the remainder of this description a reference to one of base assembles 22, 24 shall be taken to include the other. Each of base module assemblies 22, 24 includes a shroud 26 that defines an enclosure (not shown) that contains high voltage circuitry (not shown) for sensing voltages and currents of the metered electrical system. In one exemplary embodiment, meter 10 contains three separate high impedance resistive voltage dividers for sensing voltages and three separate current divider structures for sensing currents, each current divider feeding an electronic current comparator.

In one embodiment, meter 10 has a voltage rating of about 120 VAC to 480 VAC. In another illustrative embodiment, meter has a relatively low voltage rating of about 57V to about 120V Electrical components and circuitry for sensing applicable voltages and associated currents in these and other ranges are believed to be within the purview of those in the art without further explanation.

Each base module assembly 22, 24 further includes a base barrier 28 situated within base module assembly shroud 26 and serves to electrically isolate high voltage circuitry and components for sensing voltage and currents from low voltage circuitry of electronics module 14 (described below) as well as provides additional advantages described below. In a particular embodiment, base barrier 28 is fabricated from an insulative, i.e., non-conductive material, such as plastic. In alternative embodiments, other known suitable materials are employed to fabricate base barrier 28.

Electronics module 14, in one embodiment, includes a meter board 30 for providing basic metering functions, and an option board 32, such as a telecommunications board, or input/output (I/O) board for executing advanced meter features, such as establishing electronic communication with remote systems (not shown).

In an illustrative embodiment, meter board 30 includes a data acquisition platform chip, a microcomputer, nonvolatile memory devices, and six independent analog to digital converters corresponding to each sensed current and voltage signal. As such, the data acquisition platform chip receives scaled signal outputs from each of the respective voltages and currents sensed by meter 10. In alternative embodiments, multiplexing schemes could be employed in lieu of dedicated converters for each of the sensed voltage and current outputs, as described above.

The microcomputer, in one embodiment, is a 32 bit expandable single chip microcomputer that receives 16 bit data samples from the data acquisition chip. Data processing and meter functions are performed by the microcomputer, including but not limited to data sampling, data processing, digital filtering, accumulations, time keeping, register and display functions. Associated data values and program parameters are stored in non-volatile memory. EEPROM memory stores programmed operating parameters and meter data, and flash memory is employed for special program provisions and for memory intensive data applications. In accordance with known techniques, meter data quantities are updated at each power failure occurrence, and stored data is checked for errors as the microcomputer executes its prescribed functions.

A revenue guard board 34 is mounted to base barrier 28 of base module assembly 12 in a manner described below, and revenue guard board 34 interfaces with electronics module 14 to ensure metering functions even when a monitored phase of the metered system"s power supply is temporarily interrupted. For instance, in one embodiment, revenue guard board 34 is configured to monitor the A phase of a three phase power supply, but when the A phase is interrupted or otherwise fails detection, revenue guard board 34 switches to the B or C phase of the power supply and continues metering functions. As such accuracy of meter data can be maximized.

Electronics module 14 is modular, is coupled to and is contained within bezel 16 which, in turn securely fastens to base module assembly 12. A battery 36 is coupled to bezel 16 and is in communication with electronic module 14 so that data may be maintained even when the power supply to the meter is lost for not longer than a predetermined time based upon battery storage capacity. A liquid crystal display 38 is mounted to bezel 16 for communicating data, instructions, commands, and other visual indicia to a meter user.

Nameplate 18 is attached to a face of bezel 16 and includes alphanumeric indicia of interest, including but not limited to a meter serial number, firmware revision codes, installed option boards, utility information and bar codes, meter type codes, meter capability codes, and meter constants for executing certain meter functions. Of course, other items of interest may be printed on nameplate 18 in addition to or in lieu of the items described above, depending upon the end-user of the meter, the model of the meter, and the end application of the meter.

Cover 20 includes an end ring 40, a substantially cylindrical body 42 extending from end ring 40, and a front face 44 attached to body 42. End ring 40 is securely attached to base assembly 12, or more specifically to one of base module assemblies 22, 24, and cylindrical body 42 forms a protective enclosure over bezel 16 and electronics module 14. Front face 44 is fabricated from a clear material such that at least meter nameplate 18 and liquid crystal display 38 are visible through cover front face 44 when meter 10 is installed and used.

A battery cover or hatch 46, an optical port 48, and a reset mechanism 50 are affixed to or otherwise mounted on cover front face 44. Battery hatch 46 allows access to battery 36 of bezel 16, either for installation or replacement, without removal of meter cover 20. Optical port 48 is coupled to bezel 16, and, more specifically to electronics module 14, so that meter data 10 may be obtained and the microcomputer may be programmed or data updated with a hand held device in proximity to optical port 48 by infrared signal transmission. Reset mechanism 50 allows meter functions, counters, data registers, etc. to be reset as desired by an end user.

Messages displayed on liquid crystal display 38 may be employed to guide a user in meter reset functions via manipulation of reset mechanism 50, or to facilitate user selection of reset options and features available on meter 10.

Figure 2:
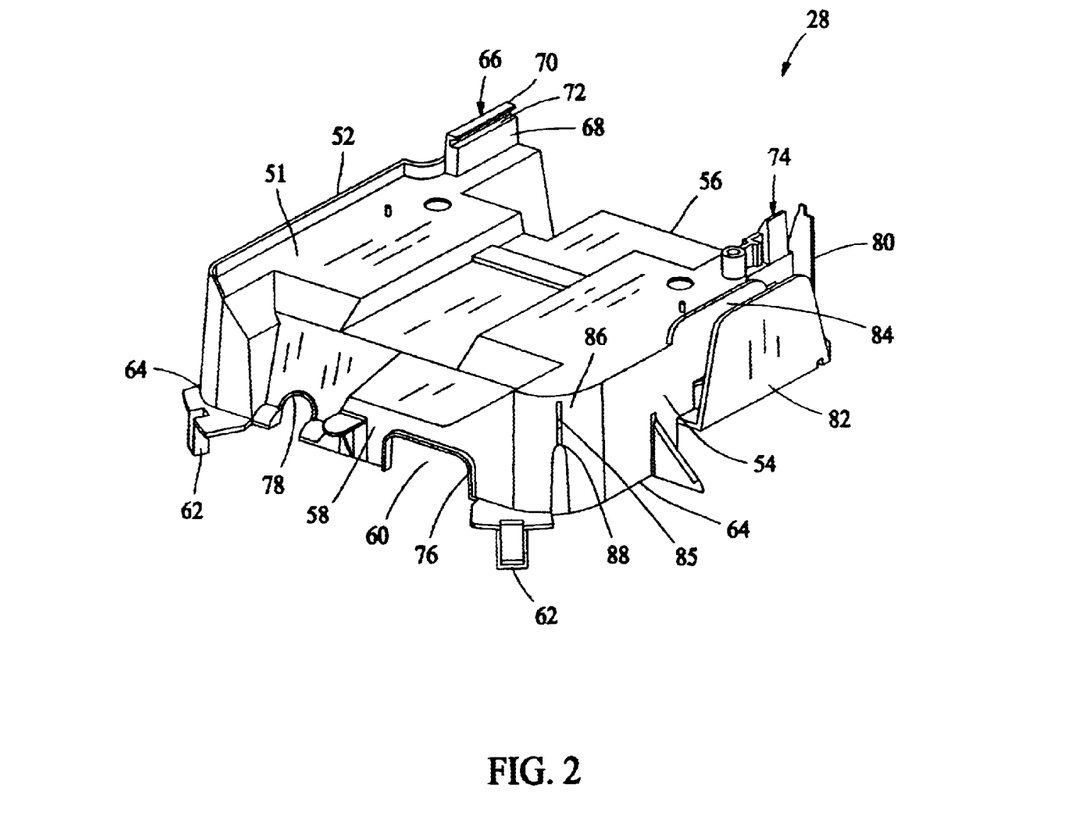
FIG. 2 is a perspective view of the base barrier shown in FIG. 1.

FIG. 2 is a perspective view of base barrier 28 including box-like body configuration having a back wall 51, opposite side walls 52, 54, and opposite upper and lower walls, 56, 58 respectively, that form a cavity 60 underneath back wall 51. Walls 51, 52, 54, 56 and 58 are each contoured for receiving voltage and current sensing components of meter base module assembly 22 or 24 (shown in FIG. 1) as well as accommodating bezel 16 (shown in FIG. 1) and electronics module 14 (shown in FIG. 1). As such, base barrier 28 forms a protective enclosure about the sensing components and circuitry when base barrier 28 is coupled to a respective base module assembly 22 or 24. Further, as base barrier 28 is fabricated from a non-conductive material, such as plastic in an exemplary embodiment, base barrier 28 electrically isolates high voltage components and circuitry of base modules 22 and 24 from lower voltage circuitry and components of electronics module 14.

A plurality of attachment formations 62 (only two of which are illustrated in FIG. 2) extend from a lower periphery 64 of base barrier 28 approximately at each corner of base barrier 28. Attachment formations 62 are received in complementary formations (not shown) in base module assemblies 22, 24 to secure base barrier 28 to the respective base module assembly.

A revenue guard board mount 66 extends above base barrier back wall 51 adjacent an upper portion of base barrier side wall 52 and upper wall 56, or in other words at the upper left hand corner of base barrier 28 as illustrated in FIG. 2. Revenue board guard mount 66, in one embodiment is generally rectangular in profile and includes a base portion 68 extending from base barrier back wall 51, and an attachment portion 70 extending upwardly from base portion 68 and forming a slot or groove 72 for retaining an edge (not shown) of a revenue guard printed circuit board, such as revenue guard board 34 (shown in FIG. 1).

A locking formation 74 extends upwardly from base barrier back wall 51 adjacent an upper portion of base barrier side wall 54 and upper wall 56, or in other words at the upper right hand corner of base barrier 28. As such locking formation 74 is positioned in general alignment with revenue guard board mount 66 on an opposite side of base barrier 28. Locking formation 74 is likewise configured to engage an edge (not shown in FIG. 2) of a revenue guard board as further described below.

Base barrier lower wall 58 includes lead openings 76, 78 for routing of lead wires (not shown in FIG. 2) from high voltage sensing circuitry of base module 22 or 24 in cavity 60 through base barrier 28 to appropriate connections in electronics module 14 located external to base barrier 28. More specifically, in the illustrated embodiment, lead opening 76 allows routing of wire leads from current sensors located internal to barrier cavity 60 to meter board 30 (shown in FIG. 1), and opening 78 allows routing of KYZ output wires for pulse meter demand functions familiar to those in the art. It is contemplated that greater or fewer wire routing openings could be provided in walls 51, 52, 54, 56 and 58 for these and other connections in alternative embodiments without departing from the scope of the present invention.

Still further, for lead wire management purposes, base barrier 28 includes a number of wire positioning features to ensure proper placement of lead wires as meter 10 (shown in FIG. 1) is assembled, installed, and serviced. More specifically, in an alternative embodiment, base barrier 28 includes a wire retaining clip 80 extending upwardly from base barrier lower periphery 64 adjacent base barrier upper wall 56 and side wall 54, i.e., at the upper right hand corner of base barrier 28 as illustrated in FIG. 2. An upstanding fin 82 extends from a lower periphery of side wall 54 substantially parallel to side wall 54 and forms a wire management pocket or trough 84 extending partially along side wall 54. A wire retaining fin 85 projects outwardly from a rounded corner surface 86 between base barrier lower wall 58 and side wall 54, i.e., at the lower right hand corner of base barrier 28 as illustrated in FIG. 2. Retaining fin 85, in one embodiment, is substantially flush with an outer surface of rounded corner 86 at an end adjacent base barrier base barrier back wall 51, and projects outwardly from the outer surface of rounded corner 86 toward base barrier lower periphery 64, ultimately terminating at a ledge 88 that extends substantially perpendicular to the outer surface of rounded corner 86. Functional attributes of these wire management features, as well as other features of base barrier 28, will be in part apparent and in part pointed out in reference to the remaining Figures.

Figure 3:
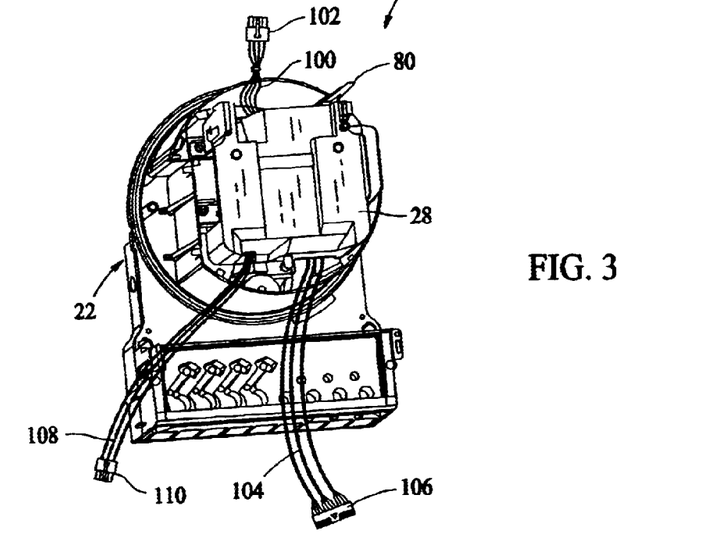
FIG. 3 is a rear perspective assembly view of a portion of the meter shown in FIG. 1.

FIG. 3 is a rear perspective assembly view of meter 10 in a partially assembled condition without revenue guard board 34 (shown in FIG. 1) installed and wherein base barrier 28 is secured to base module 22 that is wired for connection to remaining meter components. Specifically, in an illustrative embodiment, meter power supply lead wires 100 extend from base module assembly 22 through upper wall 56 (shown in FIG. 2) of base barrier 28 and terminate in a connector 102. Wire leads 104 extend from sensing circuitry of base module assembly 22 through wire lead opening 76 (shown in FIG. 2) and terminate at a connector 106. KYZ output wire leads 108 extend from base module assembly 22 through base barrier wire lead opening 78 (shown in FIG. 2) to a connector 110. Each of connectors 102, 106, 110 is configured for plug-in connection to a mating connector (not shown in FIG. 3), and to facilitate connection of wire leads 100, 104, 108, each of the wires is longer than the actual physical connection requires when meter 10 (shown in FIG. 1) is completely assembled.

Conventionally the surplus of wire leads, such as leads 100, 104, 108 is stuffed within the meter as an electronics module, such as electronics module 14 (shown in FIG. 1), and cover, such as cover 20 (shown in FIG. 1) are attached to a meter base assembly, such as assemblies 22 or 24 shown in FIG. 1. In this process, wire leads are oriented in a random fashion relative to one another, may be folded or creased upon one another, and may abut electronic components and electrical circuitry within the meter, each of which may negatively affect meter reliability, repeatability, and accuracy. These disadvantages may be avoided by employing the wire management features of base barrier 28, as further described below.

Figure 4:
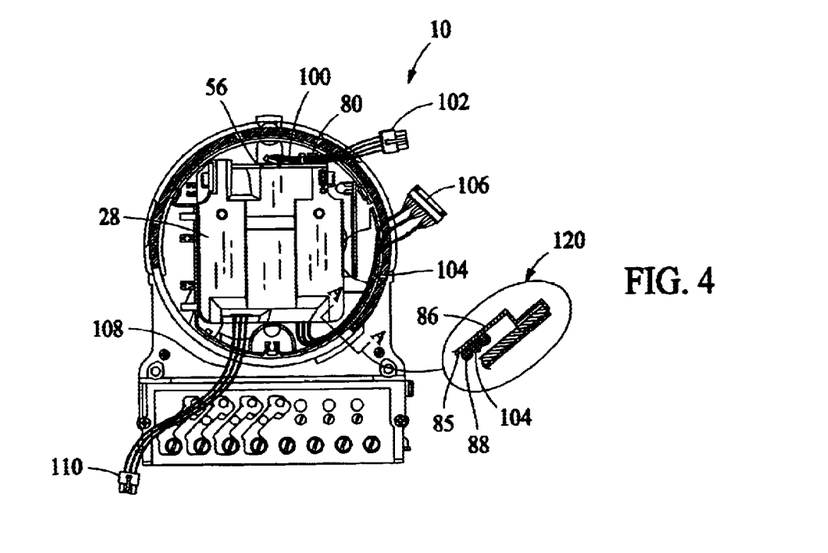
FIG. 4 is a rear elevational view of the meter shown in FIG. 3.

FIG. 4 is a rear elevational view of meter 10 similar to FIG. 3 but illustrating wire leads 100, 104, 108 in conjunction with some of the wire management features of base barrier 28. More specifically, power supply leads 100 are retained in base barrier wire clip 80 that neatly positions power supply leads 100 adjacent base barrier upper wall 56. Sensor wire leads 104 are neatly routed around base barrier rounded corner 86, as illustrated in detail 120 such that each wire lead 104 is beneath ledge 88 of barrier fin 85 (also shown in FIG. 2). As such, wire leads 100, 104 are maintained in designated positions within meter 10 to preserve meter accuracy, reliability, and repeatability.

Figure 5:
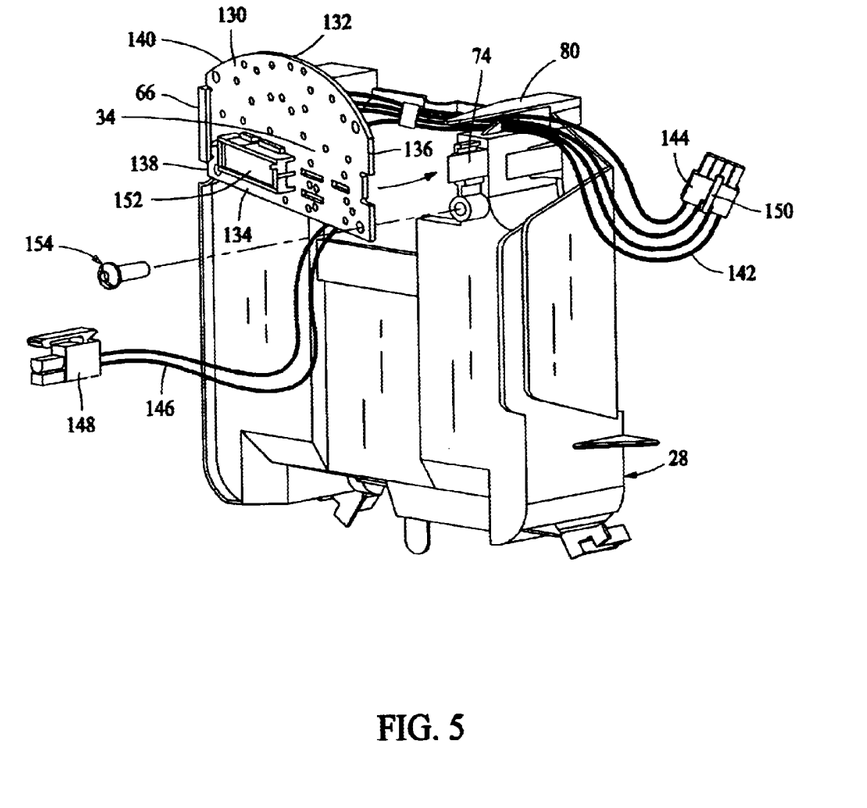
FIG. 5 is a perspective assembly view of the barrier shown in FIG. 2.

FIG. 5 is a perspective assembly view of installation of a revenue guard board, such as revenue guard board 34, on base barrier 28. Revenue guard board 34 is a printed circuit board of known construction that includes circuitry for revenue guard functions to ensure proper meter operation despite momentary lapses or interruption of the phases of the metered power supply. Revenue guard board 34 includes opposite faces 130, 132, a substantially straight lower edge 134, opposite lateral edges 136, 138 extending upward from lower edge 134, and an arcuate or curved upper edge 140 extending between lateral side edges 136, 138. Power supply leads 142 are coupled to face 132 of revenue guard board 34 and are routed through wire clip 80 of base barrier 28, ultimately terminating at a connector 144. DC output wire leads 146 are also coupled to revenue guard board face 132 and terminate in a connector 148 for connection to electronics module 14 (shown in FIG. 1). A voltage isolator connector 152, described in detail below, protrudes through board to isolate high voltage power supply contacts on revenue guard board 34.

Connectors 144, 148 (as well as connectors 102 and 110 shown in FIGS. 3 and 4) may include a locking member 150 that secures the respective connector to a mating connector with snap-fit engagement. In addition, in one embodiment, connectors 142, 148 (as well as connectors 102 and 110 shown in FIGS. 3 and 4) are fabricated from plastic, but it is contemplated that other nonconductive materials may be employed in alternative embodiments in lieu of plastic. Still further, it anticipated that female-type connectors may be equally employed in lieu of one or more of the illustrated male-type connectors 144, 148 (as well as connectors 102, 106 and 110 shown in FIGS. 3 and 4).

Revenue guard board lateral edge 138 is inserted into base barrier wire mount 66, and more specifically into revenue guard board mount groove 72 (shown in FIG. 2), and by rotating revenue guard board 34 about lateral edge 138 within wire mount 66 (as indicated by the arrow in FIG. 5), opposite lateral edge 136 of revenue guard board 24 engages base barrier locking formation 74. By depressing revenue guard board 34 in this position, locking formation 74 deflects and allows revenue guard board lateral edge to slide down locking formation member 74 and eventually snap into a locked position wherein revenue guard board lateral edges 136, 138 are securely retained by base barrier revenue guard board mount 66 and locking member 74. Additional fasteners such as a screw 154 may be employed to further secure revenue guard board 34 in position through complementary openings through revenue guard board 34 and complementary mounting formations in base barrier 28.

Thus, revenue guard board may be accurately positioned relative to electronics module 14 (shown in FIG. 1), and by employing leads and connectors 142, 146 and 144, 148, respectively, revenue guard board 34 may be quickly and easily installed at late stages of assembly or even be retrofitted to an existing meter.

Figure 6:
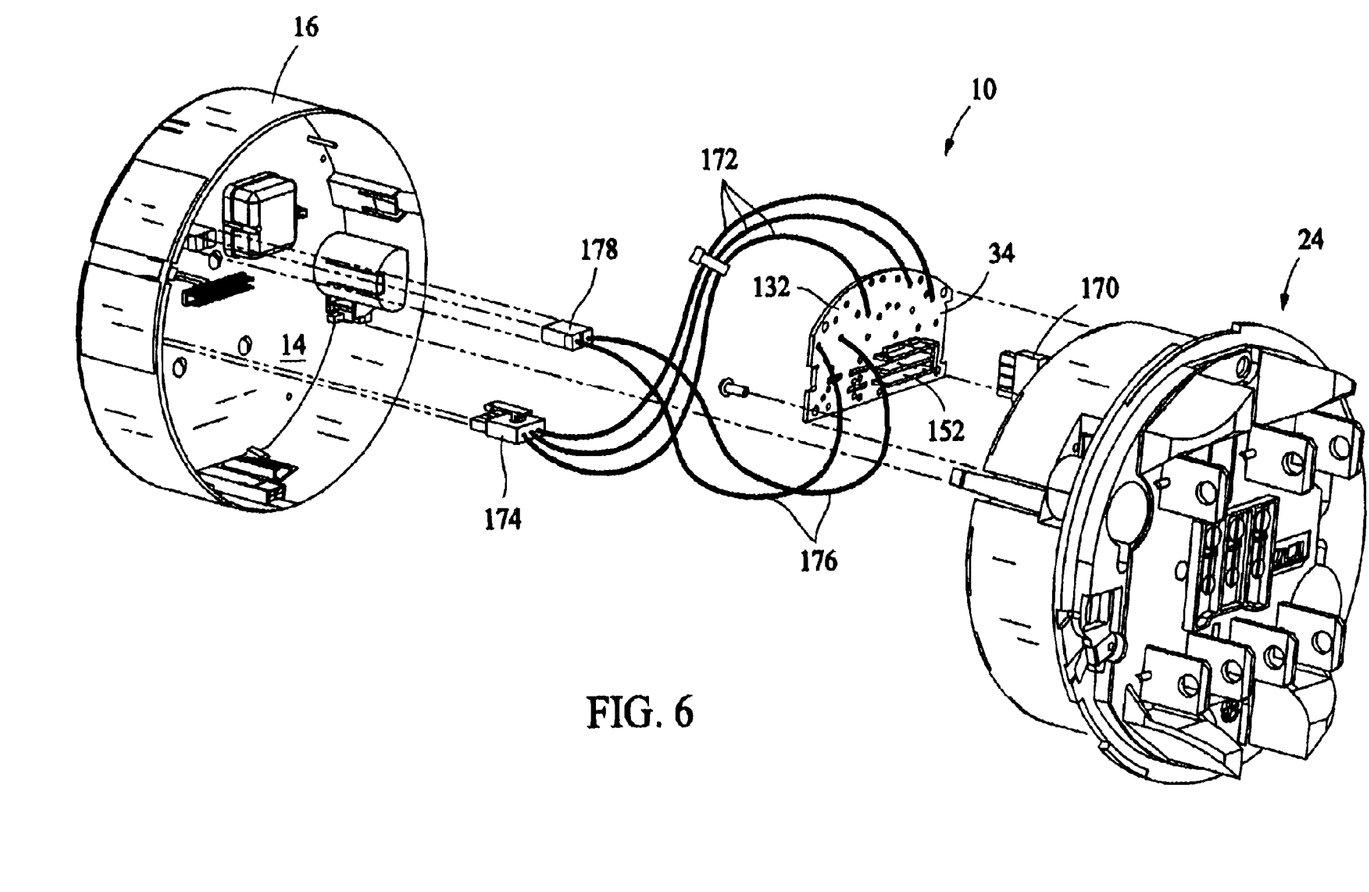
FIG. 6 is an exploded view of a portion of the meter shown in FIG. 1.

FIG. 6 is an exploded view of a portion meter 10 illustrating wire connections of revenue guard board 34 to S type base module 24 and to electronics module 14 disposed within bezel 16. Power supply leads (not shown in FIG. 6) of base module assembly 24 extend to connector 170. Voltage isolator connector 152 extends through revenue guard board 34 and beyond revenue guard board face 132 to form barriers about power supply contact pins (not shown in FIG. 6) extending from revenue guard board face 132. Connector 170 fits over voltage isolator connector 152 to establish an electrical connection between the power supply leads of base module assembly 24 and the power supply contact pins of revenue guard board 34. Power supply leads 172 extend from revenue guard board 34 to a connector 174 for plug-in connection to meter board 30 (shown in FIG. 1), thereby supplying power to electronics module 14. DC output leads 176 extend from revenue guard board 132 to a connector 178 for plug-in connection to electronics module 14 for revenue guard board input.

Once a power supply connection is established via connector 170 and isolator connector 152 over power supply contact pins on revenue guard board 34, revenue guard board 34 is mounted to base barrier 28 as described above in relation to FIG. 5. Electrical connections are established from revenue guard board 34 to electronics module 14 via connectors 174 and 178. Wire leads are routed and maintained in proper position using the above-described wire management features of base barrier 28 (shown in FIGS. 1–5), and bezel 16 is securely attached to base module assembly 24.

Figure 7:
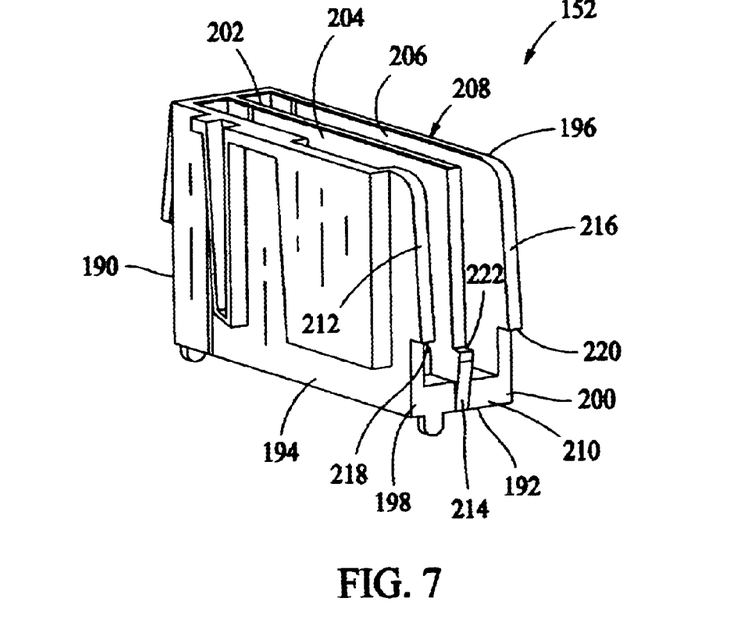
FIG. 7 is a first perspective view of a voltage isolator connector for the meter assembly shown in FIG. 5.

FIG. 7 is a perspective view of voltage isolator connector 152 (also shown in FIGS. 5 and 6). Voltage isolator connector 152 is fabricated from a nonconductive material, such as plastic in one embodiment, and includes an end wall 190, a cover 192 extending from end wall 190, and opposing side walls 194, 196 extending from opposite edges 198, 200, respectively. An internal wall 202 extends upwardly from cover 192 approximately equidistant from and substantially parallel to opposing side walls 194, 196. Thus two isolation compartments 204, 206 are formed between side walls 194, 196 that are open ended on a first end 208 opposite cover 192 and a second end 210 opposite end wall 190. Side wall 194 is contoured in a keying arrangement to ensure that connector 152 is installed properly in meter 10 (shown in FIGS. 1, 2, 3, and 6), as further described below.

Open end 210 includes three contoured positioning ribs 212, 214, 216 extending from respective side wall 194, internal wall 202, and side wall 196. Ribs 212, 216 are generally flush with a generally flat outer surface of open end 210 adjacent open end 208, and gradually extend outwardly from an outer surface of open end 210 to a support retainer ledge 218, 220 of respective ribs 212, 216. Rib 214 is generally flush with the outer surface of open end 210 adjacent cover 192 and gradually extends outwardly from the outer surface of open end 210 to a support retainer ledge 222. Support retainer ledges 218, 220 are substantially coplanar, and support retainer ledge 222 is substantially parallel to, but displaced from ledges 218, 220. Longitudinal spacing between ledges 218, 220 and 222 is selected such that a printed circuit board, such as for example meter board 30 (shown in FIG. 1) or revenue guard board 34 (shown in FIGS. 1, 5 and 6), may be retained between support ledges 218, 220 and 222 such that ledges 220 and 222 engage one face of the board, and ledge 222 engages the other face of the board.

Figure 8:
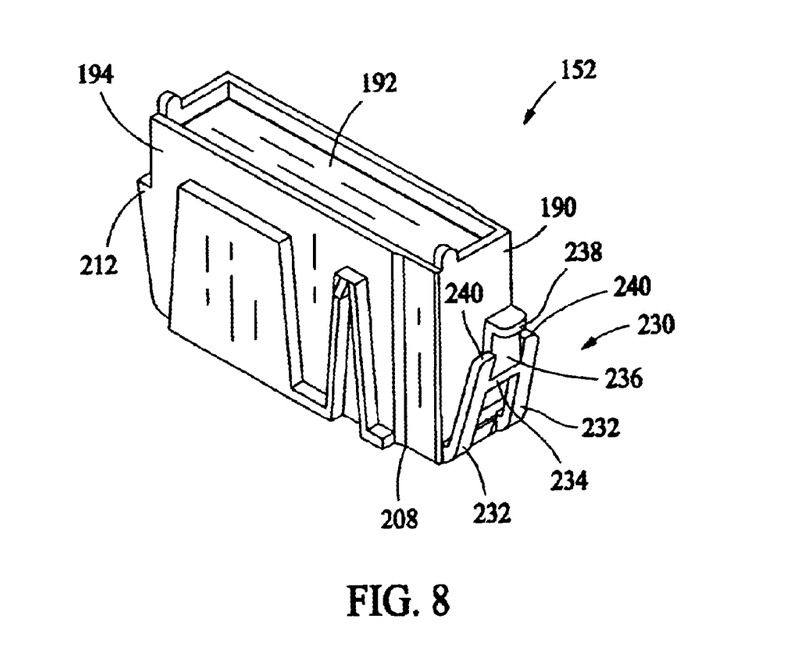
FIG. 8 is a second perspective view of the connector shown in FIG. 7.

FIG. 8 is another perspective view of isolator connector 152 illustrating closed cover 192 disposed opposite open end 208, and end wall 190 including a board retention and support member 230. Retention and support member 232 includes a pair of obliquely extending support members 232 extending from end wall 190 and linked by a cross brace 234. A retainer member 236 extends between support members 232 and end wall 190 from cross brace 234 in substantially parallel fashion to an outer surface of end wall 190, and a retention tab 238 extends outwardly from retention member 236 and is substantially perpendicular to retention member 236. Retention member tab 238 is positioned a longitudinal distance from distal ends 240 of support members 232 to accommodate a printed circuit board, such as for example meter board 30 (shown in FIG. 1) or revenue guard board 34 (shown in FIGS. 1, 5 and 6), between retention tab 238 and support member ends 240 such that retention tab 238 engages one face of the board, and support member ends 240 engage the other face of the board.

Thus, isolator connector 152 may be engaged to a printed circuit board on both of opposite end wall 190 and open end 210 by virtue of the above-described retention features.

Figure 9:
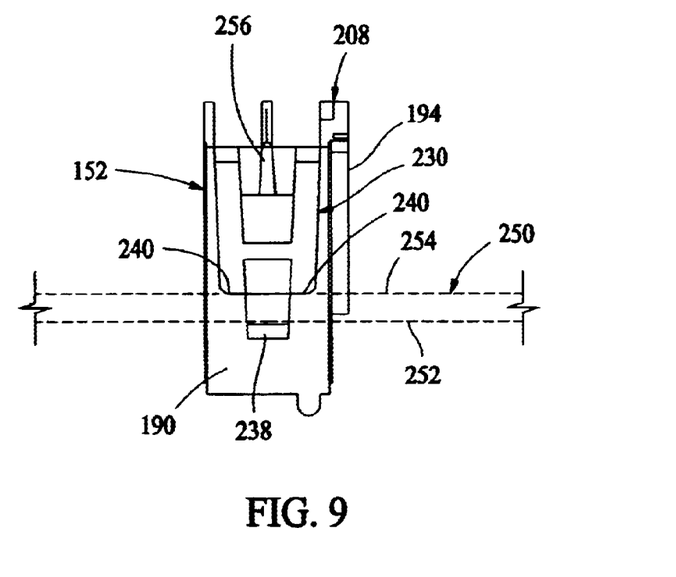
FIG. 9 is an end elevational view of the connector shown in FIGS. 7 and 8 attached to a printed circuit board.

FIG. 9 is an end elevational view of isolator connector 152 attached to a printed circuit board 250 (shown in phantom in FIG. 9). Printed circuit board 250 is a board of known construction having circuitry for performing desired functions, and in an illustrative embodiment is one of meter board 30 (shown in FIG. 1) or revenue guard board 34 (shown in FIGS. 1, 5 and 6). In still further embodiments, printed circuit board 250 could be an option board 32 (shown in FIG. 1) or another printed circuit board for non-meter applications. It is contemplated that the benefits of isolator connector 152 accrue to circuit boards generally, and accordingly there is no intention to limit practice of the invention whatsoever to a particular board, such as meter board 30, option board 32 and revenue guard board 34, for a particular purpose, such as use with meter 10 (shown in FIG. 1).

Printed circuit board 250 includes opposite faces 252, 254, and isolator connector 152 is securely attached to printed circuit board 250 via retention and support member 230 projecting from isolator connector end wall 190. More specifically, printed circuit board faces 252, 254 are retained between retention and support member retention tab 238 and support member ends 240 such that retention tab 238 engages one face 252 of printed circuit board 250, and support member ends 240 engage the other face 254 of printed circuit board 250. In addition, as described above in relation to FIG. 7, isolator connector 152 is also attached to printed circuit board 250 at isolator connector open end 210 (shown in FIG. 7) by retaining printed circuit board 250 between support ledges 218, 220 and 222 (all shown in FIG. 7) such that ledges 218 and 220 engage one face 254 of printed circuit board 250, and ledge 222 engages the other face 252 of the board. As such, isolator connector 152 is firmly engaged to printed circuit board 250 at both isolator connector end wall 190 and open end 210.

Isolator connector 152 is installed to printed circuit board 250 by inserting isolator connector open end 208 through an opening (not shown in FIG. 9 but described below) from beneath printed circuit board face 252 so that isolator connector open end 208 extends above printed circuit board face 254. Isolator connector 152 then slides through printed circuit board 250 through the opening in printed circuit board 250. As isolator connector 152 is inserted through printed circuit board 250, ribs 212, 216 on isolator connector open end 210 contact edges of the opening through printed circuit board 250, and because ribs 212, 216 are contoured outwardly, support and retention member 230 on isolator connector end wall is deflected and depressed toward an outer surface of end wall 190. Eventually, as isolator connector 152 is inserted through printed circuit board 250, ledges 218, 220 of ribs 212, 216 are cleared at which point support and retention member 230 resiliently deflects and returns to its original undepressed position. This deflection of support and retention member 230 firmly retains printed circuit board faces 252, 254 between ledges 218, 220 and 222 (see FIG. 7) at isolator connector open end 208, while retaining printed circuit board faces 252, 254 between retention tab 238 and support member ends 240 of support and retention member 230 of isolator connector end wall 190.

Therefore, by inserting isolator connector 152 through printed circuit board 250 at isolator connector open end 208, isolator connector 152 is retained by the above described retention features on isolator connector end wall 190 and open end 210 with snap-action resilience. Thus installation of isolator connector 152 may be accomplished easily by hand and without tools. In addition, because of contoured side wall 194 of isolator connector 152, and further because isolator connector includes closed cover 192 and end wall 190, isolator connector 152 may only be inserted through printed circuit board 250 when isolator connector is properly oriented with respect to printed circuit board 250. This one-way installation reduces assembly errors due to improperly installed connectors.

In addition, and as illustrated in FIG. 9, end wall 190 includes a tongue projection 256 that receives a locking member (not shown in FIG. 9) of a mating connector (not shown in FIG. 9). Thus, connectors such as connector 102 (shown in FIGS. 3 and 4), connector 144 (shown in FIG. 5) and connector 170 (shown in FIG. 6) may be employed and inserted over isolator connector open end 208 once isolator connector is installed to printed circuit board 250 (as illustrated in FIG. 6 in reference to revenue guard board 34). A locking member of such connectors, such as locking member 150 (shown in FIG. 5) of connector 144 engages tongue projection 256 with snap action engagement to securely fasten the connector to isolator connector 152. As such, not only is proper positioning of isolator connector 152 assured with respect to printed circuit board 250, but proper positioning of a mating connector is assured with respect to isolator connector 250.

Figure 10:
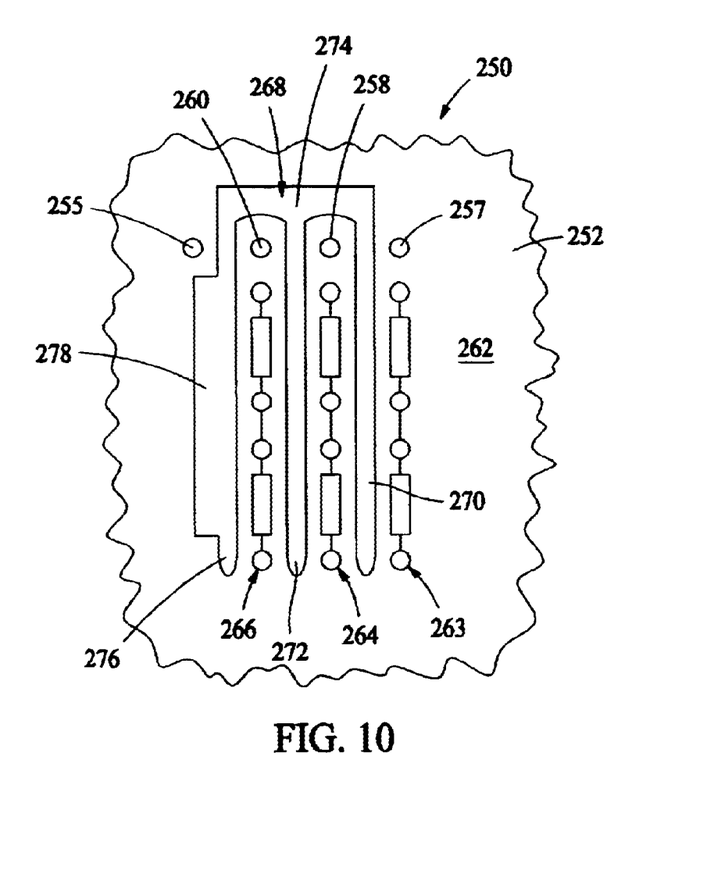
FIG. 10 is a top plan view of a portion of the printed circuit shown in FIG. 9.

FIG. 10 is a top plan view of a portion printed circuit board 250, and more specifically of printed circuit board face 254 including some circuitry that may be employed in, for example, meter 10 (shown in FIG. 1). Power supply contacts, and more specifically in the form of staked pins, including a neutral or common pin 255 an A phase pin 257, a B phase pin 258 and C phase pin 260 extend upwardly from a top surface 262 of printed circuit board face 254. Therefore, by using an appropriate connector, including but not limited to those described above, a three phase power supply connection may be established to printed circuit board 250 by establishing pins 255, 257, 258, 260 in electrical communication with electrical contacts of respective power supply leads. Each of the three power supply phase pins 256, 258, 260 is established in electrical connection with respective circuitry 263, 264, 266 integrated into printed circuit board 250.

An opening 268 is formed through printed circuit board to accommodate isolator connector 152 (shown in FIGS. 6–9). Specifically, opening 268 includes two substantially straight and parallel leg portions 270 and 272 depending from an end section 274 oriented substantially perpendicular to leg sections 270 and 272. A third leg section 276 also extends from end section 274, and includes a rectangular keying portion extending outwardly therefrom. Each of opening leg sections 270, 272, 276 extend for a substantially equal length and leg section 272 is located substantially equidistant from leg sections 270 and 276.

It may be seen by comparing FIGS. 7 and 10 that opening 268 in printed circuit board 250 is shaped to accommodate 268 isolator connector 152 open end 208. That is, opening 268 is complementary in shape to an outer contour of isolator connector 152. More specifically, when isolator connector 152 is inserted into printed circuit board 250, isolator connector end wall 190 is received in opening end section 274, isolator connector side wall 196 is received opening leg section 270, isolator connector internal wall 202 is received in opening leg section 272, and isolator connector side wall 194 is received in opening leg section 276 such that contoured portions of side wall 194 are received in opening keying portion 278.

Thus, printed circuit board opening 268 and isolator connector 152 together form an insulative, i.e., nonconductive, barrier or partition, between each of printed circuit board power supply pins 257, 258, 260 and associated respective circuitry 263, 264, 266. Thus, unintentional shorting of power supply pins 257, 258, 260 and associated circuitry 263, 264, 266 by technicians, repair persons, or other conductive components of electronics used in conjunction with printed circuit board 250, such as, for example, option board 32 (shown in FIG. 1) and revenue guard board 34 (shown in FIGS. 1, 5 and 6) is avoided.

It is appreciated that while an exemplary embodiment has now been described with respect to a specific isolator connector 152 and a specific printed circuit board opening 268, the advantages of the instant invention could likewise be achieved in alternative embodiments with alternative configurations and shapes of isolator connectors and printed circuit board openings. Furthermore, while the particular embodiment described and illustrated herein has been found particularly useful in conjunction with the above-described meter, other configurations of isolator connectors and printed circuit board openings may be found more suitable for other applications without departing from the spirit and scope of the present invention.

Figure 11:
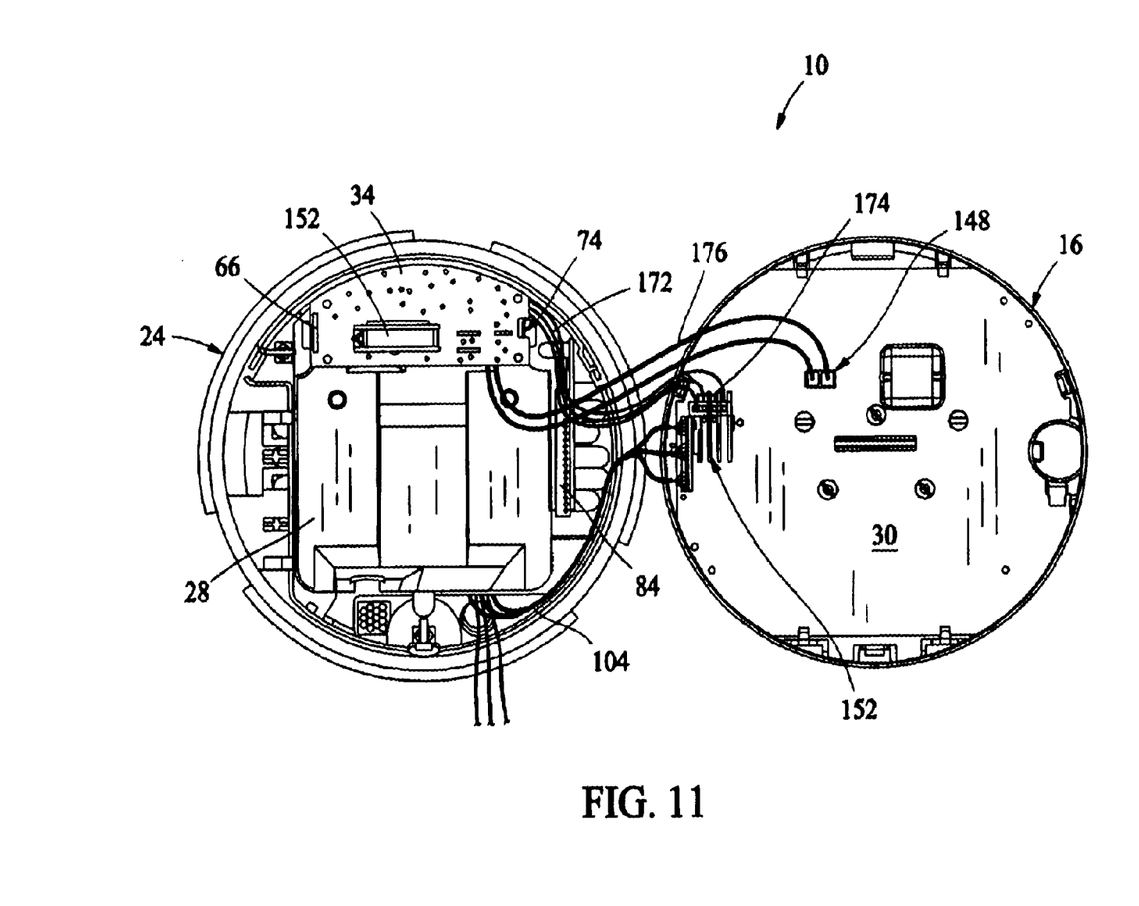
FIG. 11 is an assembled view of a portion of the meter shown in FIG. 1.

FIG. 11 is an assembled view of a portion of meter 10 wired for use. Revenue guard board 34 is mounted to base barrier 28 and retained between revenue guard board mount 66 and base barrier locking member 74. Power supply leads (not shown in FIG. 11) of base module assembly 24 are connected to revenue guard board 34 as described above in relation to FIG. 6, and revenue guard board power supply contact, such as pins 255, 257, 258, and 260 (shown in FIG. 10), are isolated from one another by employing voltage isolator connector 152. Power supply leads 172 from revenue guard board 34 are retained in base barrier wire clip 80 (shown in FIGS. 2–5), are routed into base barrier wire positioning trough 84, and ultimately connected to power supply contact pins of meter board 30 through another voltage isolator connector 152 inserted through meter board 30, and mating connector 174 inserted over voltage isolator connector 152 as described above in relation to FIGS. 9 and 10.

DC output leads 176 from revenue guard board 34 are connected to meter board 30 using mating connector 174. Meter sensor leads 104 are routed around base barrier rounded corner 86 and maintained in position by base barrier fin 85 (shown in FIGS. 2 and 4). An option board, such as option board 32 (shown in FIG. 1) may be coupled to meter board 30 before attaching bezel 16 to base module assembly 24.

For all the above reasons, base barrier 28 facilitates predictable wire placement within meter 10 that improves accuracy, repeatability, and reliability of meter 10 while simultaneously providing a barrier function to isolate high voltage meter sensing components from low voltage meter electronics, and while further providing for late point installation of revenue guard board 34 with snap-in engagement and straightforward electrical connection of wire leads with simple connectors. Voltage isolator connectors 152 provide isolation of power supply contacts and associated circuitry with straightforward installation and mating features for standard connectors to ensure a high level of isolation of power supply contacts during normal operation of meter 10. A safer, easier assembled and improved serviceability meter is therefore provided in relation to conventional meters.

While the invention has been described in terms of various specific embodiments, those skilled in the art will recognize that the invention can be practiced with modification within the spirit and scope of the claims.

What is claimed is:

1. A voltage isolator connector for a printed circuit board including a first face and a second face, said connector comprising:

an end wall comprising a retention member configured for snap-fit engagement with the printed circuit board, said retention member extending from said support member and comprising a pair of support members extending obliquely from said end wall, said pair of support members connected by a cross brace, said retention member extending from said cross brace;

a first side wall extending from the end wall;

a second side wall extending from the end wall, said first and second side walls forming an isolator compartment with said end wall, said compartment open at an end opposite said end wall and said first and second side walls configured for attachment to the printed circuit board, one of said first and second side walls includes a first positioning rib disposed opposite said end wall; and an internal wall extending from said end wall, said internal wall extending between said side walls and comprising a second positioning rib disposed opposite said end wall, one of said first and second positioning ribs configured to engage the first surface of the printed circuit board, and the other of the first and second positioning ribs configured to engage the second surface of the printed circuit board.

2. A voltage isolator connector in accordance with claim 1 further comprising a cover attached to said end wall and extending over said first and second side walls.

3. A voltage isolator connector in accordance with claim 2, wherein one of said side walls is contoured.

4. A voltage isolator connector in accordance with claim 2 wherein said isolator compartment is open at an end opposite said cover.

5. A voltage isolator connector in accordance with claim 1 further comprising at least one support member extending obliquely from said end wall, said retention member extending from said support member.

6. A voltage isolator connector in accordance with claim 1 wherein said compartment end opposite said end wall comprises an outwardly extending rib.

7. A voltage isolator connector in accordance with claim 6, wherein said rib comprises a first end and a second end, said first and flush with said compartment end opposite said end wall, said second end comprising a support retainer ledge.

* * * * *